United States Patent
Wu et al.

(10) Patent No.: US 12,170,265 B2
(45) Date of Patent: Dec. 17, 2024

(54) SEMICONDUCTOR PACKAGE

(71) Applicant: Taiwan Semiconductor Manufacturing Company, Ltd., Hsinchu (TW)

(72) Inventors: Chao-I Wu, Hsinchu County (TW); Yu-Ming Lin, Hsinchu (TW); Sai-Hooi Yeong, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 224 days.

(21) Appl. No.: 17/086,479

(22) Filed: Nov. 2, 2020

(65) Prior Publication Data

US 2021/0407966 A1    Dec. 30, 2021

Related U.S. Application Data

(60) Provisional application No. 63/045,202, filed on Jun. 29, 2020.

(51) Int. Cl.
| | |
|---|---|
| *H01L 25/065* | (2023.01) |
| *G11C 5/04* | (2006.01) |
| *G11C 5/06* | (2006.01) |
| *H01L 23/00* | (2006.01) |
| *H01L 23/538* | (2006.01) |
| *H01L 27/06* | (2006.01) |

(Continued)

(52) U.S. Cl.
CPC ............ *H01L 25/0657* (2013.01); *G11C 5/04* (2013.01); *G11C 5/06* (2013.01); *H01L 23/5384* (2013.01); *H01L 24/14* (2013.01); *H01L 27/0688* (2013.01); *H10B 61/00* (2023.02)

(58) Field of Classification Search
CPC ....... H01L 25/0657; H01L 2924/15311; H01L 2224/16146; H01L 2224/08145; H01L 2224/16145; H01L 2225/06517; H01L 2224/81191; H01L 2225/1058; H01L 23/49816; H01L 25/043; H01L 25/074; H01L 25/0756; H01L 25/117; H01L 27/0207; H10B 61/00–22; G11C 14/0036; G11C 14/0081; G11C 5/04; G11C 2211/5643
See application file for complete search history.

(56) References Cited

U.S. PATENT DOCUMENTS

| | | | |
|---|---|---|---|
| 7,615,857 B1 * | 11/2009 | Jouppi | ................ H01L 25/0657 257/679 |
| 8,993,380 B2 | 3/2015 | Hou et al. | |

(Continued)

OTHER PUBLICATIONS

Techopedia, "Cache Memory," Dec. 18, 2019, (see attached PDF with link) (Year: 2019).*

*Primary Examiner* — Nelson Garces
*Assistant Examiner* — Quinton A Brasfield
(74) *Attorney, Agent, or Firm* — JCIPRNET

(57) ABSTRACT

A semiconductor package includes a processor die, a storage module and a package substrate. The storage module includes an array of cache units and an array of memory units stacked over one another, and electrically connected to the processor die, wherein the array of cache units is configured to hold copies of data stored in the array of memory units and frequently used by the processor die. The package substrate is on which the processor die and the storage module are disposed.

21 Claims, 18 Drawing Sheets

(51) Int. Cl.
*H01L 27/22* (2006.01)
*H10B 61/00* (2023.01)

(56) References Cited

U.S. PATENT DOCUMENTS

| | | | |
|---|---|---|---|
| 9,281,254 B2 * | 3/2016 | Yu | H01L 24/97 |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 * | 8/2017 | Su | H01L 25/50 |
| 11,043,472 B1 * | 6/2021 | Dokania | G11C 5/025 |
| 2009/0196086 A1 * | 8/2009 | Pelley | H01L 23/49827 |
| | | | 438/109 |
| 2011/0304349 A1 * | 12/2011 | Stillman | G01R 31/2886 |
| | | | 324/762.04 |
| 2016/0218083 A1 * | 7/2016 | Kariyazaki | H01L 23/147 |
| 2018/0005916 A1 * | 1/2018 | Chen | H01L 23/3675 |
| 2018/0122773 A1 * | 5/2018 | Nagai | H01L 25/0652 |
| 2018/0158771 A1 * | 6/2018 | Akiba | H01L 23/528 |
| 2019/0198083 A1 * | 6/2019 | Biswas | G11C 7/10 |
| 2020/0185367 A1 * | 6/2020 | Bhagavat | H01L 25/16 |
| 2021/0248094 A1 * | 8/2021 | Norman | G06F 12/0893 |

* cited by examiner

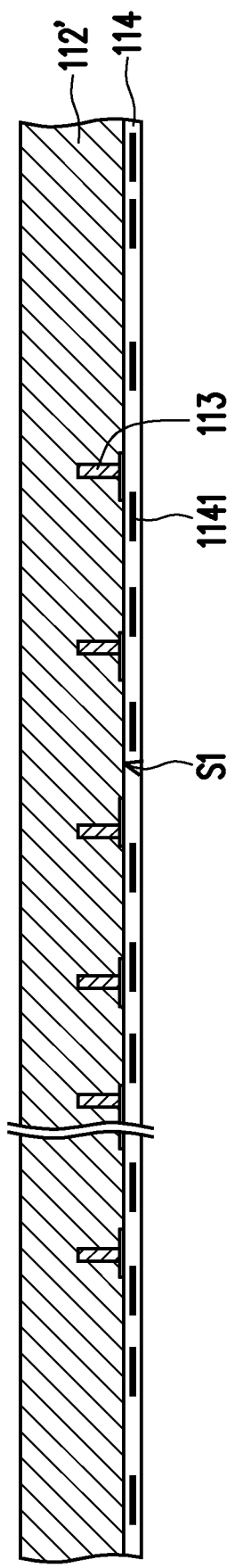
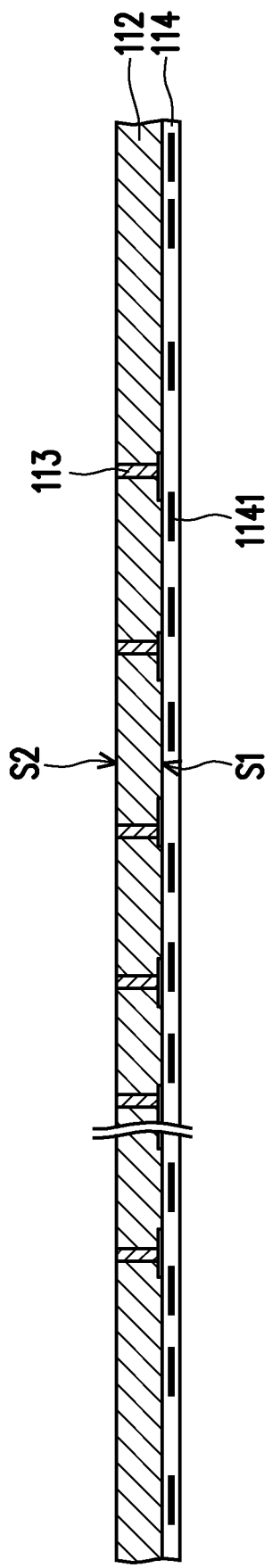
FIG. 2
FIG. 3

SEMICONDUCTOR PACKAGE

CROSS-REFERENCE TO RELATED APPLICATION

This application claims the priority benefit of U.S. provisional application Ser. No. 63/045,202, filed on Jun. 29, 2020. The entirety of the above-mentioned patent application is hereby incorporated by reference herein and made a part of this specification.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 to FIG. 7 illustrate a cross sectional view of an intermediate stage in a manufacturing of a semiconductor package according to some exemplary embodiments of the present disclosure.

DETAILED DESCRIPTION

Figure 1:
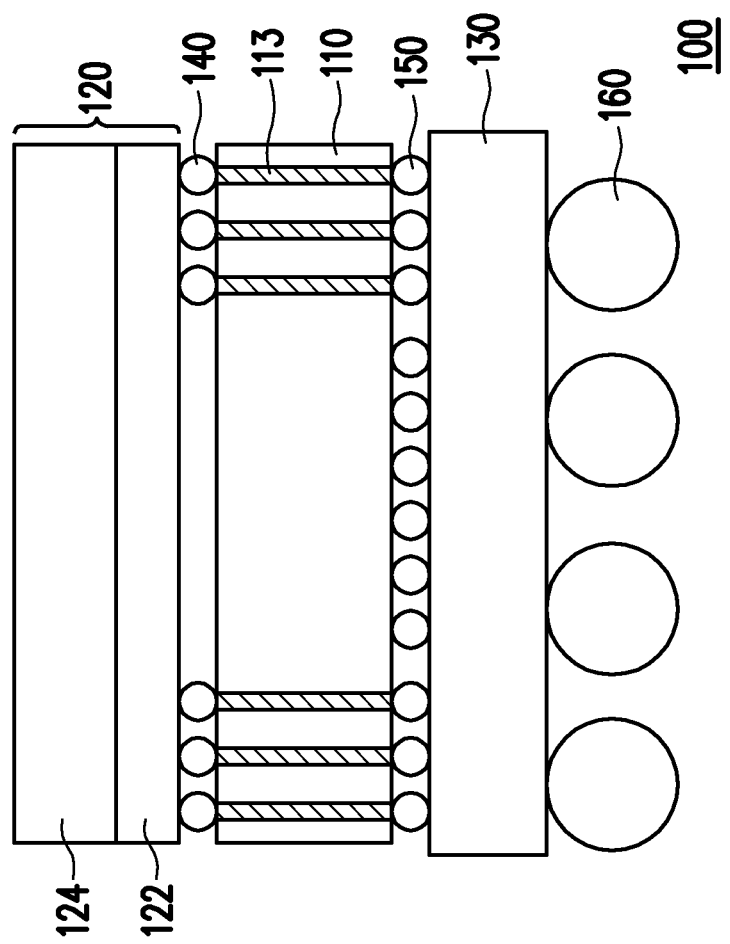
FIG. 1 illustrates a cross sectional view of a semiconductor package according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

FIG. 1 illustrates a cross sectional view of a semiconductor package according to some exemplary embodiments of the present disclosure. Described herein are semiconductor packages and manufacturing methods for implementing 2.5D and/or 3D memory stacked die systems. Referring to FIG. 1, for instance, there is disclosed in accordance with one embodiment, a semiconductor package 100 includes a processor die 110, a storage module 120 electrically connected to the processor die 110 and including a one or more memory layers and a package substrate 130 on which the processor die 110 and the storage module 120 are disposed. In some embodiments, the processor die 110' may be a logic device die including logic circuits therein. In some embodiments, the processor die 110 may include a plurality of individual and separate processing units provided in an array having rows and columns. In other forms the processing units may be placed in an array of geometric configurations other than rows and columns of processing units. Each of the processing units is any type of a variety of data processors. For example, the processing die may include a central processing unit (CPU), a digital signal processor, a graphics-specific processor, a microcontroller unit (MCU), a communications processor or any other type of processing unit. Further, the processing units may be the same type of processing unit or may vary between types of processing unit across the processor die 110'. When functionally differing types of processing units are implemented, the circuit area consumed by each processing unit may differ.

In some embodiments, the processor die 110 may include the processing units and an external connection region that is peripheral to the processing units. Accordingly, a plurality of conductive bumps 150 such as solder bumps are placed at the external connection region for providing further electrical connection of the process die 110. In this embodiment, external connection region is an area of the process die 110 where electrical connection from external to the process die 110 is made. Underlying the conductive bumps 150 within the external connection region are contact pads and conductive routings (not visible from FIG. 1) that connect the conductive bumps 150 to predetermined circuitry within the process die 110. The conductive bumps 150 communicate power, data, control signals and address signals and provide a way to obtain external access to the processor die 110.

In accordance with some embodiments of the disclosure, FIG. 1 illustrates a semiconductor package 100 having both a processor die 110, e.g., a system on chip (SOC), at a lower layer also called "logic die", a functional silicon die or a functional semiconductor device and then a storage module 120 at an upper layer. There is further depicted the package substrate 130 which is interfaced with the processor die 110 and the storage module 120 via a plurality of conductive bumps 150, e.g., a ball grid array (BGA), as shown. Electrical interconnects of the storage module 120 are electrically interfaced to the package substrate 130 through the through vias 124, e.g. through silicon vias (TSVs), through interlayer vias (TIVs), or the like, and then through the conductive bumps 150 and to the package substrate 130. Additionally depicted are the solder balls 160 to provide electrical connectivity between the substrate and another board, such as a main board, a printed circuit board (PCB), motherboard, etc. The semiconductor package 100 illustrated herein provides at least one three dimensional (3D) stacked storage module 120 (e.g., the cache die 122 and the memory die 124) which are tightly integrated into the microprocessors, such as the SOC die 110.

In some embodiments, the processor die 110 may include a memory cache such as a static random-access memory (SRAM) for the processor die 110. In general, SRAM is a static random access memory and has various types such as an asynchronous static random access memory and a synchronous static random access memory depending upon internal configuration and difference in an interface. Any static random access memory can be used for the memory cache of the processor die 110. Other memory die configurations may be used according to a specific application.

according to some exemplary embodiments of the present disclosure.

Figure 13:
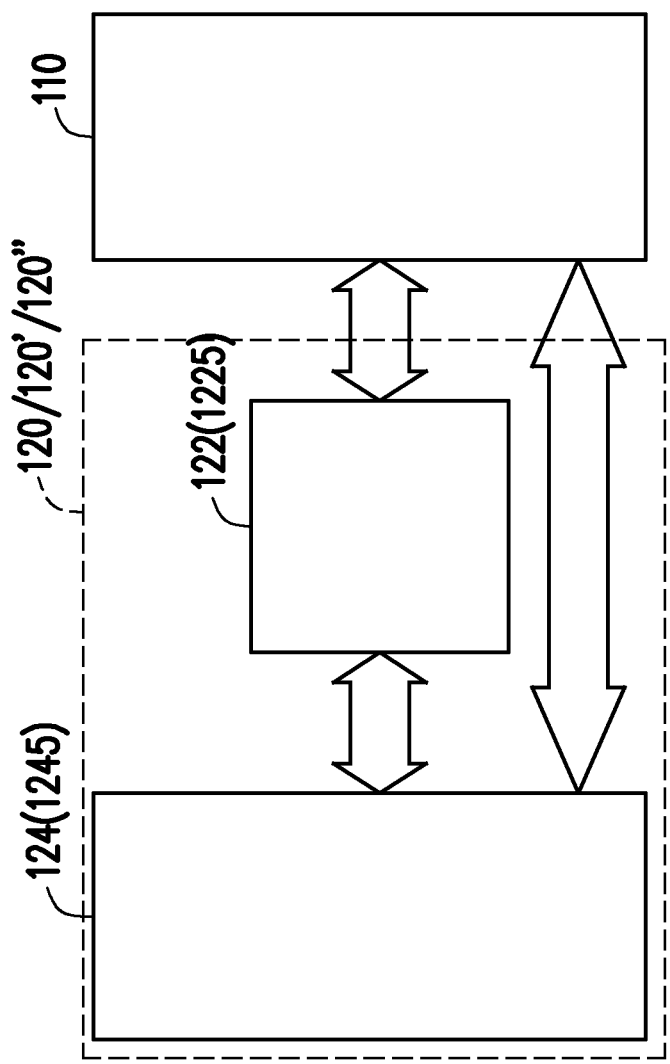
FIG. 13 illustrates a block diagram of a semiconductor package according to some exemplary embodiments of the present disclosure.

FIG. 13 illustrates a block diagram of a semiconductor package according to some exemplary embodiments of the present disclosure. Referring to FIG. 1 and FIG. 13, in some embodiments, the storage module 120 is electrically connected to the processor die 110 and includes an array of cache units, e.g., the cache units 1225 shown in FIG. 13, and an array of memory units, e.g., the memory units 1245 shown in FIG. 13, stacked over one another. The array of cache units 1225 is configured to hold copies of data stored in the array of memory units 1245 and frequently used by the processor die 110. In the present embodiment, the storage module 120 includes a cache die 122 having the array of cache units 1225 and a memory die 124 stacked over the cache die 122 and having the array of memory units 1245.

In some embodiments, each of the cache units 1225 is a semiconductor cache (i.e. memory) and can be any type of cache memory. For example, each of the cache units of the processor die 110 may be static random access memory (SRAM), FLASH memory, magnetoresistive random access memory (MRAM), dynamic random access memory (DRAM) or any other type of memory. In the present embodiment, the type of the processing units of the processor die 110 may be (include) SRAM and the type of the cache units of the cache die 122 may be (include) MRAM, for example. In other words, the cache die 122 includes an array of MRAM cache units. In some embodiments, the type of the array of memory units of the memory die 124 may includes non-volatile memory (NVM), Vertical NAND flash memory, NOR flash memory, dynamic random access memory (DRAM), flash memory, phase change memory (PCM), resistive random access memory (RRAM), which may be a slower data store than the cache die 122. In some embodiments, the memory die 124 may be a 2D memory device or a 3D memory device.

In some arrangements, the 3D memory device may include a plurality of ridge-shaped stacks, in the form of multiple strips of semiconductor material separated by insulating material. The strips of semiconductor material are horizontal channels of memory cells in NAND strings, for example. The strips of semiconductor material have side surfaces on the sides of the ridge-shaped stacks. A plurality of word lines, which can be coupled to row decoders, extends orthogonally over the plurality of ridge-shaped stacks. Memory elements lie between the surfaces of the stacks and the word lines. The memory elements are programmable and nonvolatile, like the programmable resistance structures or charge trapping structures, or programmable and volatile. The combination of the conformal word line, the memory element and the semiconductor strips within a stack forms a stack of memory units (cells).

In some embodiments, each cache unit of processor die 110 may be connected to a specific designated one of the cache units of cache die 122. It should be understood that there may be provided some physical separation and interconnect between each of the cache units of the cache die 122. The array of cache units 1225 of the cache die 122 is configured to store data so that future requests for that data can be served faster. The data stored in the cache units might be the result of an earlier computation or a copy of data stored elsewhere, e.g., the array of memory units of the memory die 124. A cache hit occurs when the requested data can be found in the cache die 122, while a cache miss occurs when it cannot. Cache hits are served by reading data from the cache units, which is faster than re-computing a result or reading from a slower data store, e.g., the memory die 124. Thus, the more requests that can be served from the cache, the faster the system performs. In some embodiments, cache density (capacity) of the cache die 122 (MRAM, for example) may be greater than cache density (capacity) of the processor die 110 (SRAM, for example), so the cache die 122 can handle much more data at once than the processor die 110 can, which improves the efficiency of the system.

In the embodiment shown in FIG. 1, the storage module 120 is disposed on the processor die 110, and the processor die 110 is disposed on the package substrate 130. In some embodiments, the processor die 110 includes a plurality of through vias 113 extending through the processor die 110 and electrically connecting the storage module 120 and the package substrate 130. One of the manufacturing methods for manufacturing such semiconductor package 100 may include the following steps.

FIG. 2 to FIG. 7 illustrate a cross sectional view of an intermediate stage in a manufacturing of a semiconductor package according to some exemplary embodiments of the present disclosure. Referring to FIG. 2, in some embodiments, a semiconductor wafer 112' is first provided. The semiconductor wafer 112' is used to form the processor die 110 of FIG. 1 after a subsequent dicing process. The semiconductor wafer 112' includes an active surface S1, and a plurality of through (silicon) vias 113 formed in an interior thereof. In addition, the active surface S1 of the semiconductor wafer 112' includes a first wiring layer 114. The first wiring layer 114 includes a first interconnect (e.g., backend-of-line interconnect) 1141, and the first interconnect 1141 is connected to one end of each of the through vias 113.

With now reference to FIG. 2 and FIG. 3, the back surface (opposite to the active surface S1) of the semiconductor wafer 112' is subjected to a film thinning treatment such as back grinding treatment to expose the other end of each of the through vias 113. By the film thinning treatment conducted here, the thickness of the semiconductor wafer 112' is reduced to a value close to the target thickness of the final semiconductor wafer 112. The grinding amount is therefore a difference obtained by subtracting the target thickness of the wafer from the original thickness of the wafer.

Figure 4:
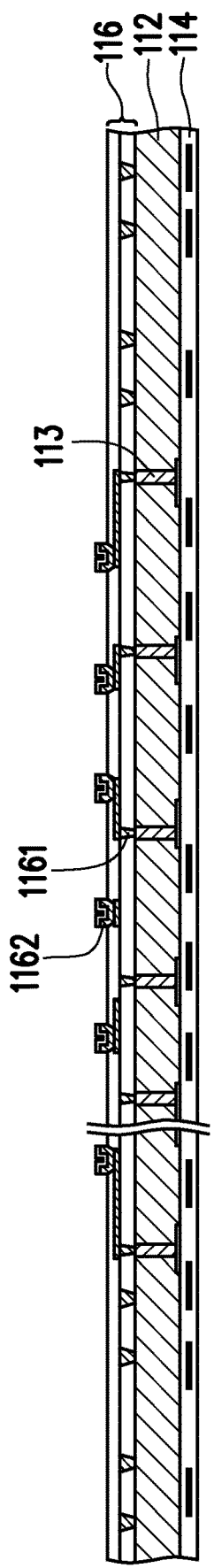

Then, referring to FIG. 4, a second wiring layer 116 is formed on the back surface S2 of the semiconductor wafer 112. The second wiring layer 116 includes therein a plurality of second interconnects 1161, which are connected to the other end of the through vias 113. In some embodiments, the second wiring layer 116 may be a stack of a single or multiple metal layers and dielectric layers. Then, a plurality of bump pads 1162 may be formed on the uppermost dielectric layer and electrically connected to the second interconnects 1161. In the plating process, in order to increase the solderability between the bump pads 1162 and the subsequently bonded conductive bumps 140, a copper layer and a nickel-gold stack layer may be formed by plating. A gold layer may be used as the surface layer of the plated structure, which has good wettability, thus increasing the yield of the subsequent soldering process.

Figure 5:
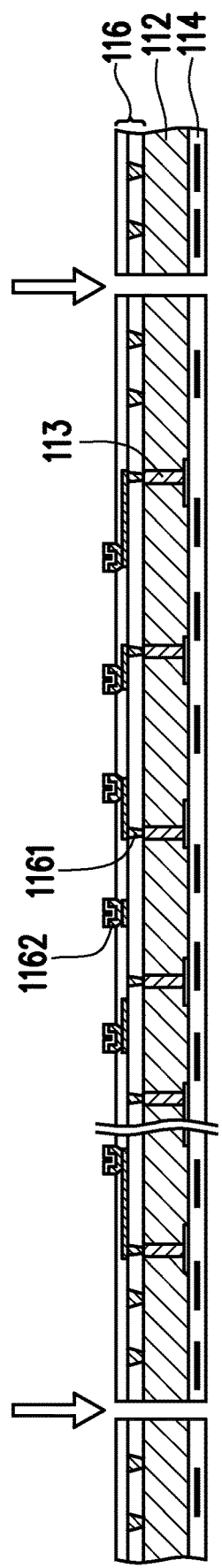
Figure 6:
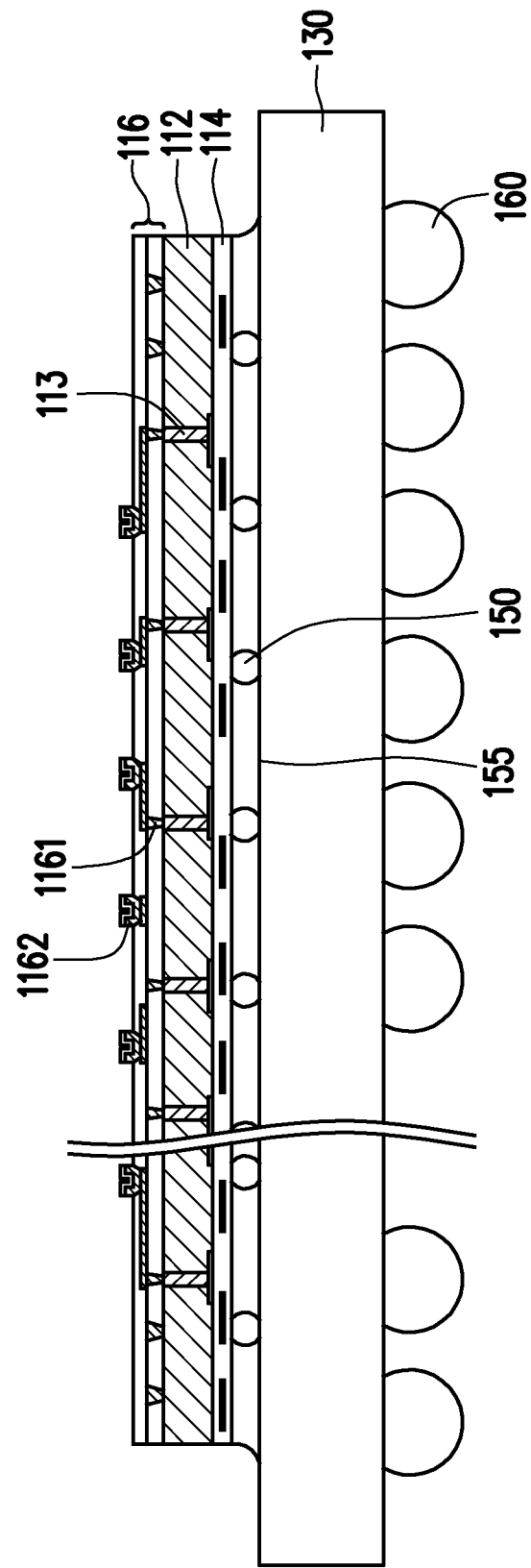

Referring to FIG. 5, in some embodiments, the semiconductor wafer 112 is then sawed into a plurality of the individual processor dies 110. Then, referring to FIG. 6, after the semiconductor wafer 112 is sawed, one of the individual processor die 110 is flip-chip bonded to the package substrate 130. The through vias 113 of the processor die 110 are electrically connected to the package substrate 130 via the conductive bumps 150. Additionally, in the present embodiment, an underfill 155 may be filled between the processor die 110 and the package substrate 130 to enclose the conductive bumps 150. The underfill 155 may be pre-formed on the package substrate 130 before the processor die 110 is bonded to the package substrate 130, or filled between the processor die 110 and the package substrate 130 after the processor die 110 is bonded to the package substrate 130.

Figure 7:
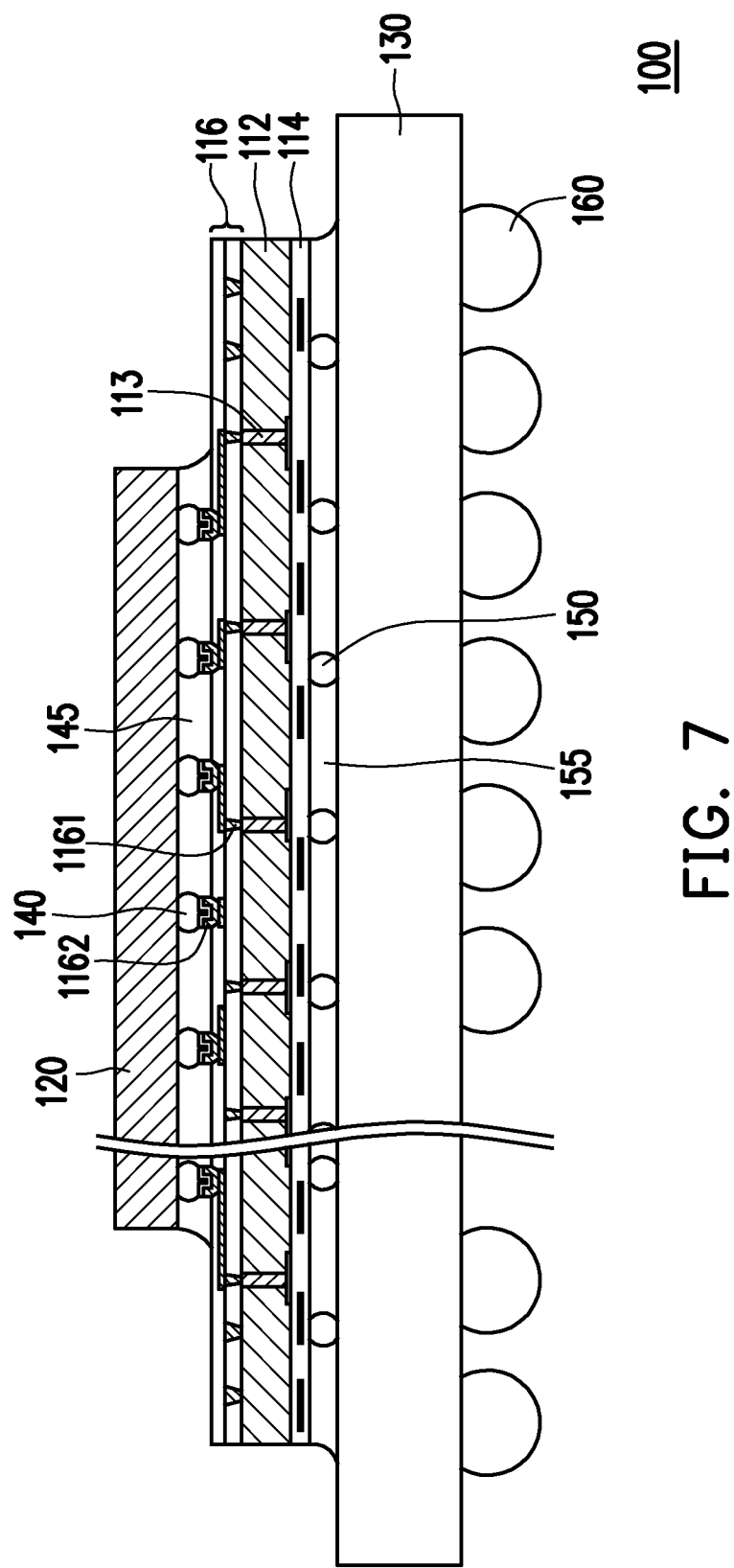

Then, as shown in FIG. 7, the storage module 120 including the cache die 122 and the memory die 124 is flip-chip bonded to the processor die 110. In some embodiments, the storage module 120 is flip-chip bonded to the processor die 110 through the conductive bumps 140. The storage module 120 is connected to the bump pads 1162 through corresponding conductive bumps 140. Additionally, in the present embodiment, an underfill 145 is optionally applied between the storage module 120 and the second wiring layer 116, with the underfill 145 enclosing the conductive bumps 140. The step of filling underfill 145 may be performed before or after the storage module 120 is flip-chip bonded to the processor die 110. That is, the underfill 145 may be formed on the second wiring layer 116 before the storage module 120 is bonded to the processor die 110, or may be filled between the storage module 120 and the second wiring layer 116, after the storage module 120 is bonded to the processor die 110. At this point, the manufacturing process of the semiconductor package 100 may be substantially done.

It is noted that the resultant structure shown in FIG. 4 is a semi-finished product of the processor die 110, which may be shipped in the form of wafers or individual dies after a sawing process. As such, in an alternative embodiment, a plurality of storage modules 120 including the cache die 122 and the memory die 124 may be flip-chip bonded to the semiconductor wafer 112 shown in FIG. 4 through the conductive bumps 140 before the sawing process. Similarly, an underfill 145 is optionally applied between the storage modules 120 and the second wiring layer 116, with the underfill 145 enclosing the conductive bumps 140. After the storage modules 120 are flip-chip bonded to the semiconductor wafer 112, the semiconductor wafer 112 is sawed into a plurality of individual processor dies 110. Then, one of the processor dies 110 is flip-chip bonded to the package substrate 130. The through vias 113 of the processor die 110 are electrically connected to the package substrate 130 via the conductive bumps 150. Additionally, the underfill 155 may also be filled between the processor die 110 and the package substrate 130 to enclose the conductive bumps 150. The disclosure does not limit the order of the process.

Figure 8:
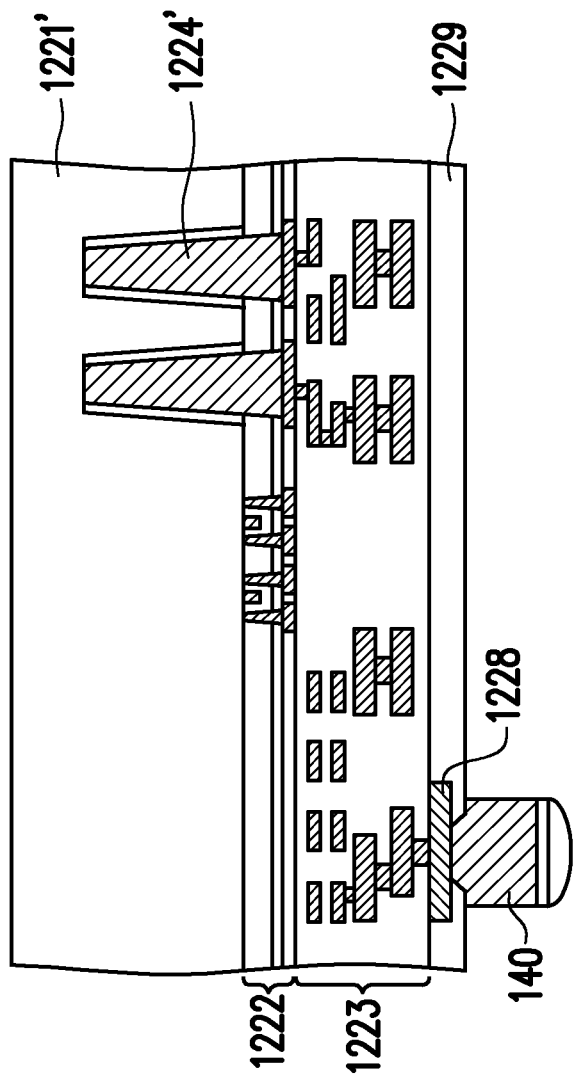
FIG. 8 to FIG. 10 illustrate a cross sectional view of an intermediate stage in a manufacturing of a semiconductor package according to some exemplary embodiments of the present disclosure.
Figure 9:
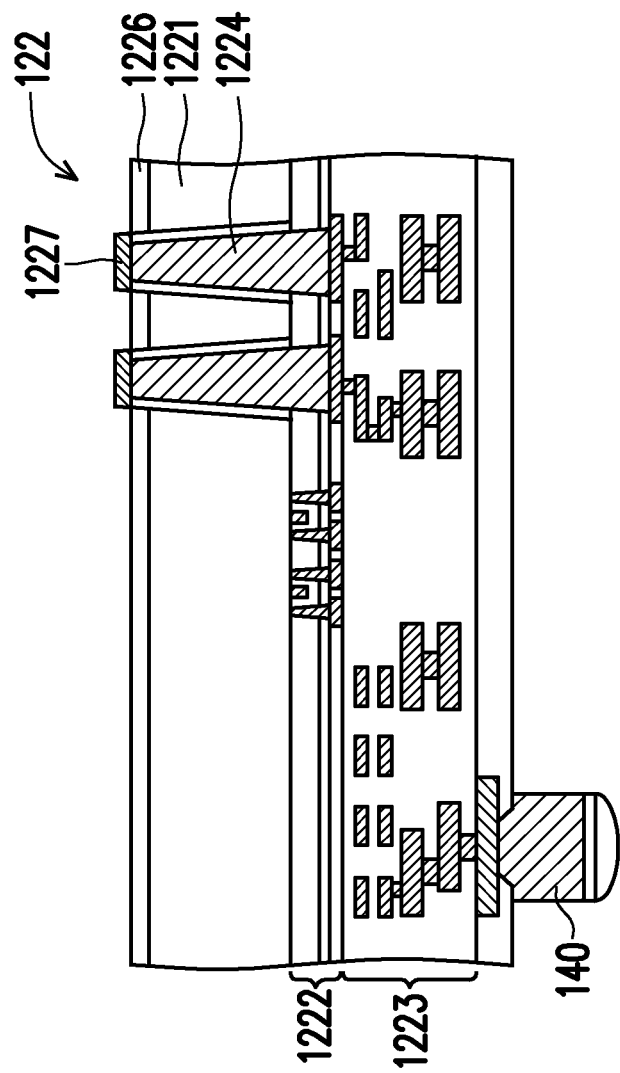
Figure 10:
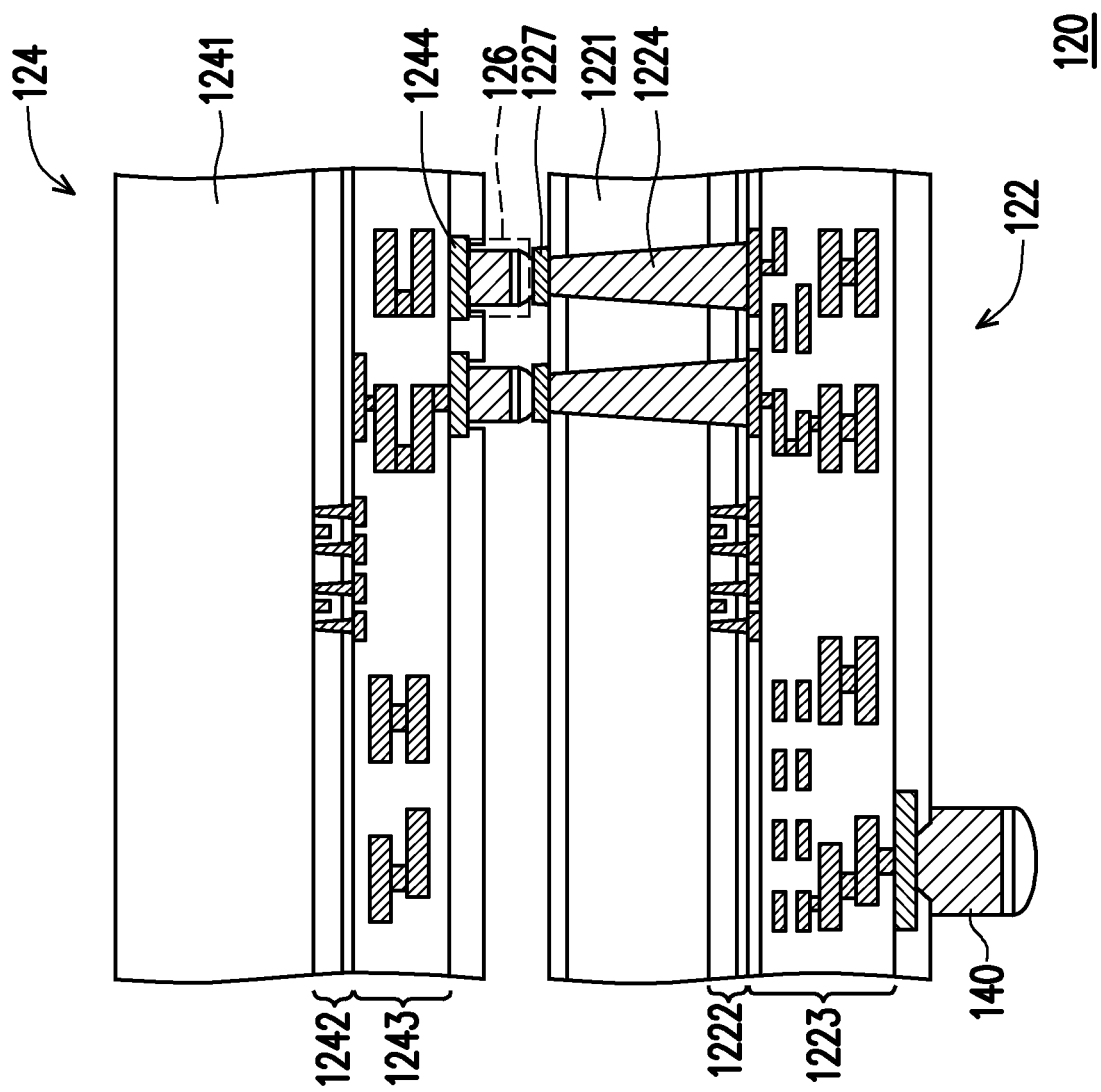

FIG. 8 to FIG. 10 illustrate a cross sectional view of an intermediate stage in a manufacturing of a semiconductor package according to some exemplary embodiments of the present disclosure. In some embodiments, the storage module 120 may be formed by stacking the memory die 124 and the cache die 122 on top of one another. The following description illustrates one of the possible process of fabricating the storage module 120.

FIG. 8 illustrates a semi-finish product of the cache die 122, which may still be in a wafer form. As shown in FIG. 8, at least one through substrate via 1224' is formed. The through substrate vias 1224' may be firstly buried in the substrate 1221' of the cache die 122 and connected to buried wirings of the cache die 122 (e.g., buried wiring from front end of line 1222 of the cache die 122) that are electrically connected to the array of cache units 1225. The buried wiring is formed on the through via 1224 as needed. A multilayer intermediate level buried wiring (for example, back end of line (BEOL) 1223 buried in an intermediate level. At least one electrode pad 1228 (for example, an aluminum pad) is formed over the back end of line 1223, and a portion thereon except for a pad opening is covered with a final passivation film 1229. At least one conductive bump 140 such as copper bump electrode is formed on the electrode pad 1228. In some embodiments, a solder barrier metal film (for example, a nickel film) may be formed on the conductive bump 140 by electroplating or the like, and a solder layer 28 (for example, a tin-silver-based solder) such as lead-free solder may be formed on the solder barrier metal film by electroplating or the like.

Then, referring to FIG. 8 and FIG. 9, the back surface of the substrate 1221' is subjected to film thinning treatment such as back grinding treatment to expose the other end of the through substrate vias 1224. By the film thinning treatment conducted here, the thickness of the substrate 1221 is reduced to a value close to the target thickness of the final substrate 1221 of the cache die 122. Accordingly, the through substrate vias 1224 vertically extend through the substrate 1221 of the cache die 122 and are electrically connected to the array of cache units 1225. Then, backside bonding pads 1227 may be formed over the back surface of the substrate 1221 and electrically connected to the through substrate vias 1224. The formation of the bonding pad 1227 may include, but not limited thereto, the following steps.

In some embodiments, the through substrate vias 1224 may be protruded a little from the back surface of the substrate 1221 by slightly etching the silicon substrate 1221 on the back side of the substrate 1221 by using, for example, dry etching (using a halogen-based gas as a gas system). This etching is so-called back etching. Then, a resin film such as polyimide is applied, as a backside insulating film 1226, to almost the entire back surface of the substrate 1221, followed by CMP or etch-back to planarize it and expose the lower end portions of the through substrate vias 1224 again. Then, a metal film such as a titanium film, a copper film, a nickel film, and the like are formed on almost the entire back surface of the substrate 1221, for example, by sputtering. The resulting metal film is then patterned, for example, by wet etching to form the bonding pad 1227.

Then, referring to FIG. 10, the resulting structure shown in FIG. 9 is attached to a dicing tape attached to a dicing frame. In this state, the resulting structure in a wafer form is divided into a plurality of individual cache dies 122, for example, by dicing. Then, the memory die 124 is bonded to the back surface of one of the cache dies 122 through a plurality of conductive bumps 126 by, for example, solder bonding. In some embodiments, the bonding pad 1227 on the back surface of one of the cache dies 122 may be bonded to the conductive bumps 126 on the bonding pads 1244 of the memory die 124 by, for example, solder bonding. By this bonding, a plurality of through substrate vias 1224 are electrically connected to the conductive bumps 126 provided, for example, on the memory die 124. In some embodiments, the conductive bumps 126 may include micro bumps. The memory die 124 may be formed in a similar manner as the cache die 122 and includes a substrate 1241, a front end of line 1242 formed over the substrate 1241, and a back end of line 1243 formed over the front end of line 1242.

Figure 11:
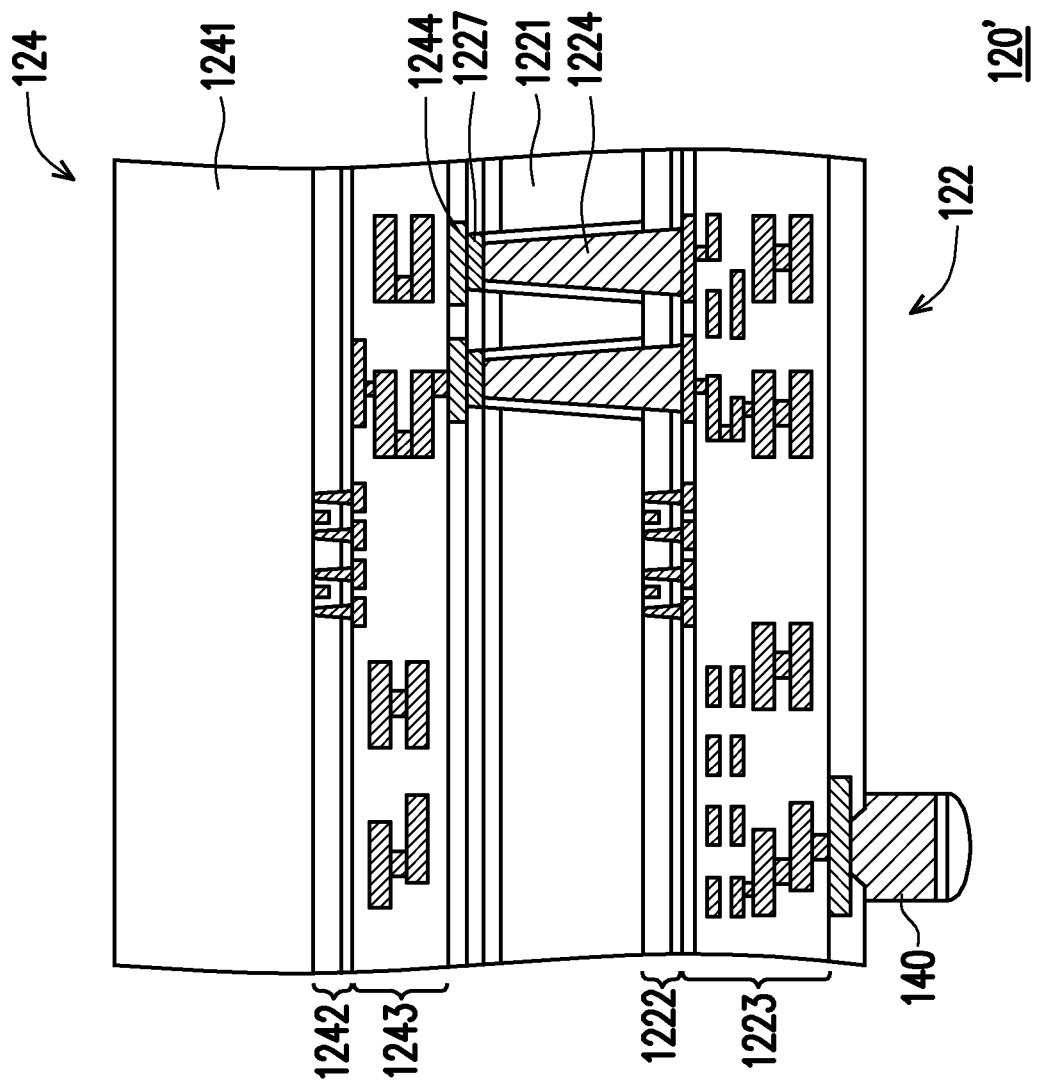
FIG. 11 illustrates a cross sectional view of a storage module of a semiconductor package according to some exemplary embodiments of the present disclosure.

FIG. 11 illustrates a cross sectional view of a storage module of a semiconductor package according to some exemplary embodiments of the present disclosure. It is noted that the storage module 120' shown in FIG. 11 contains many features same as or similar to the storage module 120 disclosed earlier with FIG. 8 to FIG. 10. For purpose of clarity and simplicity, detail description of same or similar features may be omitted, and the same or similar reference numbers denote the same or like components. The main differences between the storage module 120' shown in FIG. 11 and the storage module 120 disclosed earlier with FIG. 8 to FIG. 10 are described as follows.

Referring to FIG. 11, in some embodiments, at least one bonding pad 1244 of the memory die 124 is directly bonded to at least one bonding pad 1227 of the cache die 122. In other words, the memory die 124 may be bonded to the cache die 122 through a hybrid bonding technique. In general, hybrid bonding includes direct metal-to-metal bonding of the metal features in the memory die 124 and the cache die 122 as well as fusion bonding insulating materials in the memory die 124 with insulating materials in the cache die 122.

Direct bonding may occur between the bonding pad 1244 of the memory die 124 and the bonding pad 1227 of the cache die 122. The bonding of the bonding pads 1244 to the bonding pad 1227 is representative of a pad to pad hybrid bonding. In an alternative embodiment, the bonding between the memory die 124 and the cache die 122 may also be a via to via hybrid bonding, a via to pad hybrid bonding, pad to via hybrid bonding, or the like. The bonding pads of the memory die 124 and the cache die 122 are made of conductive materials, such as copper, gold, tin, and the like, or alloys thereof. The conductive materials of each of the vias or bonding pads in the memory die 124 can be the same or different than the conductive materials in the cache die 122.

In addition, the cache die 122 and the memory die 124 also include an insulating material 1227a and 1224a, respectively. The insulating material 1227a and 1224a can be an oxide, oxynitride, dielectric, polymer, and so forth. In some embodiments, insulating material 1227a can be the same material as insulating material 1224a, while in other embodiments, the insulating material 1227a can be different than the insulating material 1224a.

In some embodiments, in a hybrid bonding process, the bonding pads of the cache die 122 are aligned and contacted to the bonding pads of the memory die 124. Insulting materials 2337a of cache die 122 are also be contacted to insulating materials 1224a of memory die 124. Subsequently an anneal may be performed to directly bond the conductive materials and fusion bond the insulating materials together. The anneal causes the inter-diffusion of the metals in the pads of the cache die 122 and the pads of memory die 124 to cause a direct metal-to-metal bond. The resulting bonds between the insulating materials 1227 and 1244 are insulator-to-insulator bonds, which may be inorganic to polymer, polymer to polymer, or inorganic to inorganic bonds in accordance with various embodiments.

In some embodiments, hybrid bonding may enable connectors to have a fine pitch. As such, hybrid bonding may allow dies, such as the cache die 122 and the memory die 124 to have a high density of connections. Further, the hybrid bonding process allows for the bond between the two structures to not include a solder material, and thus, may increase the reliability and yield of package structures. Further still, because no connectors are used between dies, the hybrid ponding process results in a thinner die stack.

Figure 12:
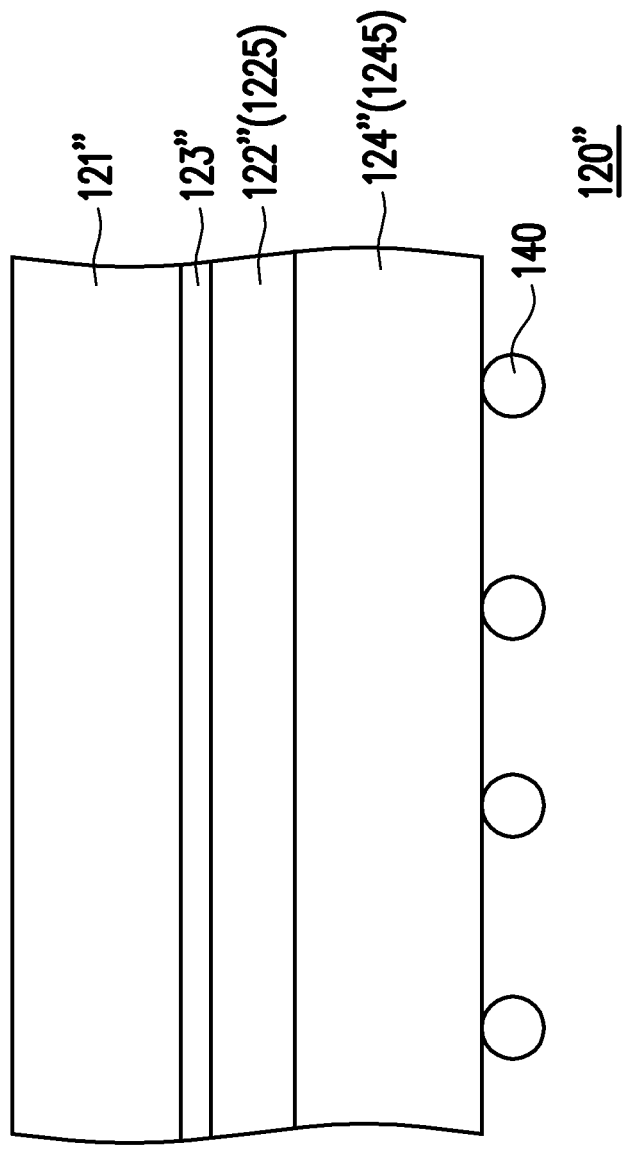
FIG. 12 illustrates a cross sectional view of a storage module of a semiconductor package according to some exemplary embodiments of the present disclosure.

FIG. 12 illustrates a cross sectional view of a storage module of a semiconductor package according to some exemplary embodiments of the present disclosure. It is noted that the storage module 120" shown in FIG. 12 contains many features same as or similar to the storage module 120 disclosed earlier with FIG. 8 to FIG. 10. For purpose of clarity and simplicity, detail description of same or similar features may be omitted, and the same or similar reference numbers denote the same or like components. The main differences between the storage module 120" shown in FIG. 12 and the storage module 120 disclosed earlier with FIG. 8 to FIG. 10 are described as follows.

With now reference to FIG. 12, in the present embodiment, the cache die 122 and the memory die 124 may be integrated into one memory die 120". Namely, the storage module 120" is, in fact, a memory die 120" including an array of cache units 1225 and an array of memory units 1245 stacked over each other on a substrate 121". In some embodiments, the array of cache units 1225 is disposed in a first back end of line structure 122" over a front end of line structure 123", and configured to hold copies of data stored in the array of memory units 1245 and frequently used by the processor die 110. In such embodiment, the array of memory units 1245 is disposed in a second back end of line structure 124", and the array of memory units 1245 includes a vertically-stacked memory unit array, i.e., a 3D memory unit array. That is, the type of the memory die 120" is a 3D memory. The 3D memory includes 3D Non-Volatile Memory (NVM), 3D NAND flash memory or Vertical NAND (V-NAND) flash memory, 3D NOR flash memory, etc.

In some embodiments, the array of memory units 1245 includes vertically stacked memory cells respectively including a thin film transistor using an oxide semiconductor layer as a channel. In other words, the memory units 1245 include an oxide semiconductor vertical channel. In one embodiment, the oxide semiconductor vertical channel is a metal oxide semiconductor. The oxide semiconductor may have a crystalline structure. For Vertical NAND (V-NAND)

or 3D NAND memory, the memory cells are vertically stacked and a charge trap flash architecture is adopted. The vertical layers allow larger areal bit densities without requiring smaller individual cells. With such configuration, the array of memory units 1245 is capable of being stack on top of one another. Therefore, for the embodiment of the cache die 122 and the memory die 124 being integrated into one memory die, the type of the memory units 1245 should be a 3D memory.

In addition, in some embodiments, the array of cache unit 1225 may adopt a MOSFET channel, which may include a front end of line structure (e.g., the front end of line structure 123"). Accordingly, in such embodiment, the memory units 1245 are formed over such cache units 1225 (formed after the formation of the cache units 1225). In other words, such cache units 1225 are located between the substrate 121" (and the front end of line structure 123") and the array of memory units 1245. In an alternative embodiment of the cache unit 1225 not using a MOSFET channel (e.g., using OTS selectors instead), the array of 3D memory units 1245$y$ may be formed before or after formation of the array of the cache units 1225. That is, the memory units 1224 may also be disposed between the substrate 121" (and the front end of line structure 123") and the array of cache units 1225. In some embodiments, the type of the cache units 1225 is MRAM, but the disclosure is not limited thereto. In other embodiment, the type of the cache units 1225 may also include SRAM, (3D) NAND, (3D) NVM, (3D) NOR, DRAM, PCM, RRAM, or the like.

Referring to FIG. 13, with such configuration, the processor die 110 is coupled to the storage module 120, 120', 120''' including the array of cache units 1225 and the array of memory units 1245. Accordingly, when the requested data can be found in the cache units 1225, the processor die 110 read the data from the cache units 1225, which is faster than re-computing a result or reading from a slower data store, e.g., the memory die 124. When the requested data cannot be found in the cache units 1225, the processor die 110 may request data from the memory units 1245. The processor die 110 may also be configured to write data into the cache units 1225 and the memory units 1245, and the memory units 1245 may be configured to update the data in the cache units 1225. Therefore, by configuring the storage module 120, 120', 120''' with the cache die 122 (or the array of cache units 1225), more requests can be served from the cache units 1225, so as to improve the system performance. In addition, the cache density (capacity) of the cache die 122 (MRAM, for example) is greater than cache density (capacity) of the processor die 110 (SRAM, for example), so the cache die 122 can handle much more data at once than the processor die 110 can, which improves the efficiency of the system.

Figure 14:
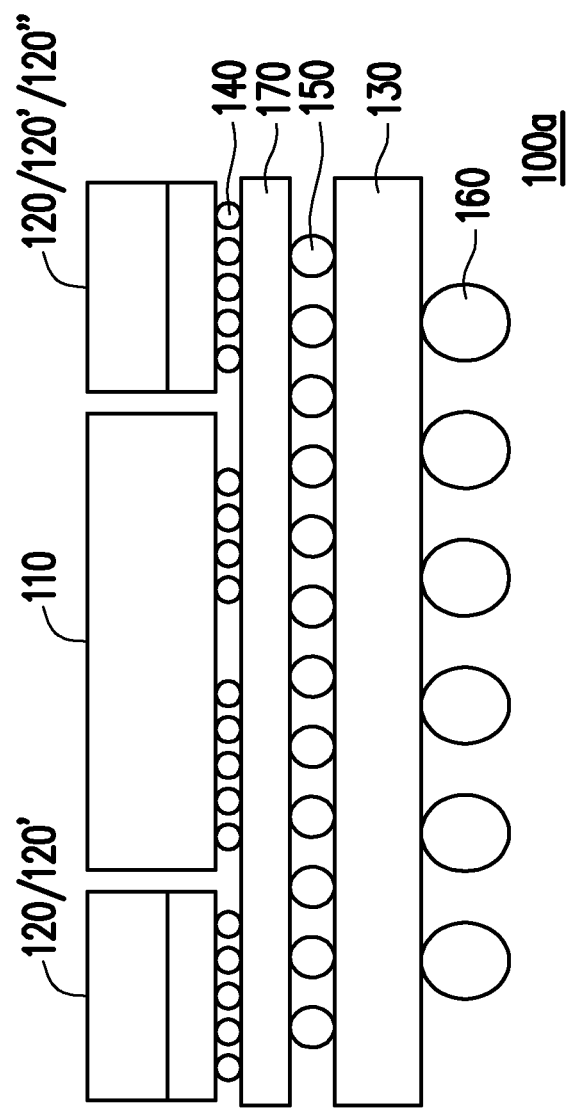
FIG. 14 illustrates a cross sectional view of a semiconductor package according to some exemplary embodiments of the present disclosure.

FIG. 14 illustrates a cross sectional view of a semiconductor package according to some exemplary embodiments of the present disclosure. It is noted that the semiconductor package 100*a* shown in FIG. 14 contains many features same as or similar to the semiconductor package 100 disclosed earlier with FIG. 1 to FIG. 7. For purpose of clarity and simplicity, detail description of same or similar features may be omitted, and the same or similar reference numbers denote the same or like components. The main differences between the semiconductor package 100*a* and the semiconductor package 100 disclosed earlier with FIG. 1 to FIG. 7 are described as follows.

With now reference to FIG. 14, in some embodiments, the semiconductor package 100 further includes an interposer 170 disposed on the package substrate 130, and the processor die 110 and the storage module 120, 120', or 120" are disposed on the interposer 170 in a side by side manner. In the present embodiments, the storage module can be any embodiments illustrated above, which means the cache die 122 and the memory die 124 of the storage module can be bonded with micro bumps, bonded by hybrid bonding or integrated into one memory die. In the present embodiment, the processor die 110 and the storage module 120, 120', or 120" are interconnected to the interposer via interconnects (e.g., conductive bumps 140). The interconnects 140 in this exemplary embodiment are, for example, dense die-to-die flip-chip micro bumps; however, other types of die-to-die fine pitch interconnects may be used.

In some embodiments, the processor die 110 and the storage module 120, 120', or 120" are connected to upper surface of interposer 170 via the a portion of die-to-die interconnects 140, which may be fine pitch interconnects or may be conventional flip-chip micro bumps. Some of the die to die interconnects 140 may be coupled to other larger interconnects, which are referred to herein as "connectors" (e.g., conductive bumps 150) so as not to be confused with die-to-die interconnects ("interconnects") 140. For example, connectors 150 may be coupled to interconnects 140 using through substrate vias, such as through-silicon vias ("TSVs"), for example. In this embodiment, connectors 150 are micro-balls; however, other types of chip-to-chip large-scale interconnects may be used. Again, connectors 150 are substantially larger than interconnects 140. As interconnect density is greater with interconnects 140 than connectors 150, bandwidth may be enhanced for an IC as previously described. Furthermore, in this exemplary embodiment, the interposer 170 is silicon interposer; however, in other embodiments other types of substrates or die platforms may be used.

FIG. 15 to FIG. 22 illustrate a cross sectional view of an intermediate stage in a manufacturing of a semiconductor package according to some exemplary embodiments of the present disclosure. The exemplary embodiment depicts another manufacturing method for forming a semiconductor package 100*b*. It is noted that the semiconductor package 100*b* and manufacturing method thereof shown in FIG. 15 to FIG. 22 contains many features same as or similar to the semiconductor package 100 and manufacturing method thereof disclosed earlier with FIG. 1 to FIG. 7. For purpose of clarity and simplicity, detail description of same or similar features may be omitted, and the same or similar reference numbers denote the same or like components. The manufacturing process of the exemplary embodiment may include the following steps.

Figure 15:
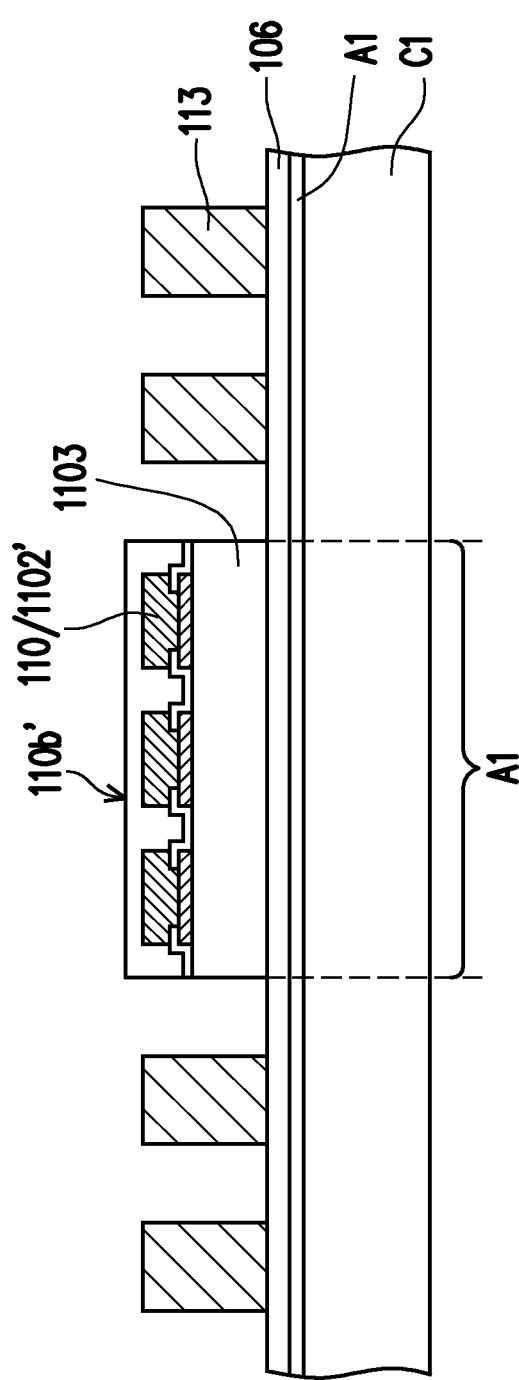
FIG. 15 to FIG. 22 illustrate a cross sectional view of an intermediate stage in a manufacturing of a semiconductor package according to some exemplary embodiments of the present disclosure.

Referring to FIG. 15, at least one processor die 110*b'* as shown in FIG. 15 is provided on a carrier C1. In some embodiments, an adhesive layer A1 may be disposed on the carrier C1. In some embodiments, the carrier C1 may be a glass carrier, a ceramic carrier, or the like. The adhesive layer A1 may be a light to heat conversion release coating (LTHC), or the like. In some embodiments, an insulation layer 106 may be optionally disposed on the carrier C1. In addition, a plurality of through vias (conductive posts) 113 are provided on the carrier C1, and the through vias 113 may surround a device area where the processor die 110*b'* is disposed. The through vias 113 may be provided on the carrier C1 before or after the processor die 110*b'* is disposed. The disclosure is not limited thereto. In some embodiments, the processor die 110*b'* may be a logic device die including logic circuits therein. For example, the processing die may include a central processing unit (CPU), a digital signal processor, a graphics-specific processor, a microcontroller unit (MCU), a communications processor or any other type of processing unit. Further, the processing units may be the same type of processing unit or may vary between types of processing unit across the processor die 110b'. Although one processor die 110b' is illustrated, more dies may be placed over the carrier C1 and level with one another.

In some embodiments, the carrier C1 may include a plurality of die areas A1 arranged in, for example, an array manner. Accordingly, the through vias 113 may be formed to surround each of the die areas A1 as it is illustrated in FIG. 15, and a plurality of processor dies 110' may be disposed on the die areas A1 respectively, so the through vias 113 may surround each of the processor dies 110'. With such arrangement, a plurality of semiconductor packages can be formed concurrently. For the sake of brevity and clarity, the manufacturing process of one of the semiconductor packages is illustrated in FIG. 15 to FIG. 22. For example, one of the processor dies 110' surrounded by some of the through vias 113 are illustrated in FIG. 15.

In some embodiments, the through vias 113 may be pre-formed, and are then placed on the carrier C1. In alternative embodiments, the through vias 113 may be formed by, for example, plating process. The plating of the through vias 113 may be performed before the placement of the processor die 110b', and may include forming a seed layer (not shown) over carrier C1, forming and patterning a photo resist layer (not shown), and plating the through vias 113 on the portions of the seed layer that are exposed through the photo resist layer. The photo resist layer and the portions of the seed layer covered by the photo resist layer may then be removed. The material of the through vias 113 may include copper, aluminum, or the like. Accordingly, the bottom ends of the through vias 113 are substantially level with the back surface of the processor die 110b'.

In some exemplary embodiments, a plurality of conductive vias 1101 (such as copper vias) may be formed on an active surface (e.g. the top surface) of the processor die 110b' over the substrate 1103 of the processor die 110b'. In some embodiments, a dielectric layer 1102' may be formed on the active surface (e.g. the top surface) of the processor die 110b', and may cover the top surfaces of the conductive vias 1101. In other embodiments, the top surface of the dielectric layer 1102' may be substantially level with the top surfaces of the conductive vias 1101. Alternatively, the dielectric layer 1102' may be omitted. In some embodiments, the top ends of the through vias 113 may be substantially level with the top surfaces of the conductive vias 1101. In other embodiments, the top ends of the through vias 113 may be substantially higher or lower than the top surfaces of the conductive vias 1101.

Then, the processor die 110b' and the through vias 113 on the carrier C1 are at least laterally encapsulated by an encapsulating material 115. In other words, the encapsulating material 115 is provided over the carrier C1 to at least laterally encapsulate the through vias 113 and the processor die 110b'. In some embodiments, the encapsulating material 115 fills the gaps between the processor die 110b' and the through vias 113. The encapsulating material 115 may include a molding compound, an epoxy, or a resin, etc.

Figure 16:
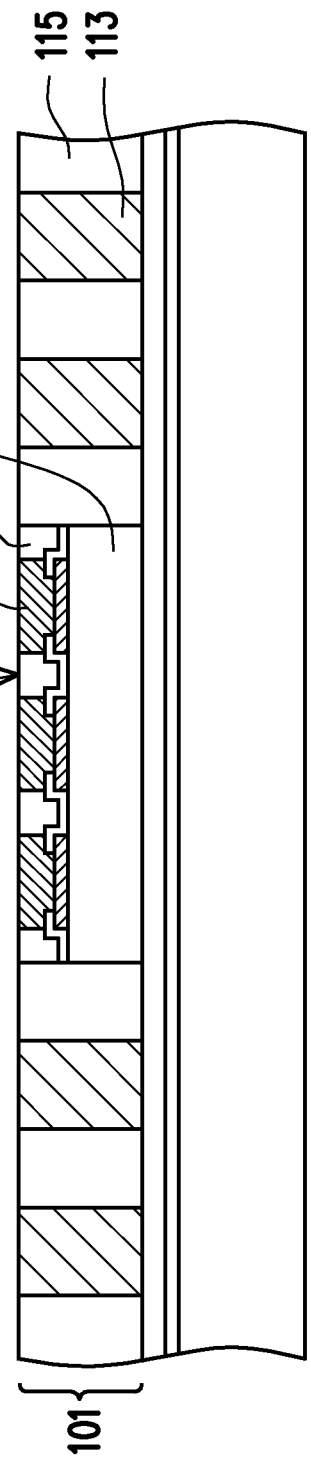

In some embodiments, the encapsulating material 115 firstly covers the top ends of the through vias 113 and the top surface of the dielectric layer 1102'. Then, a thinning process, which may be a grinding process, is performed to thin the encapsulating material 115 (and the dielectric layer 1102') until the top ends of the through vias 113 and the top surfaces of the conductive vias 1101 are revealed. The resulting structure is shown in FIG. 16. Due to the thinning process, the top ends of the through vias 113 are substantially level with the top surfaces of the conductive vias 1101, and are substantially level with the top surface of the encapsulating material 115 and the top surface of the dielectric layer 1102 as shown in FIG. 16. Throughout the description, the resultant structure including the processor die 110, the through vias 113 and the encapsulating material 115 as shown in FIG. 16 is referred to as encapsulated processor die 101, which may have a wafer form in the process. Accordingly, in the encapsulated processor die 101, the processor die 110 is disposed at the die area, the through vias 113 extend through the encapsulated processor die 101 outside of the die area A1, and the encapsulating material 115 laterally encapsulates the processor die 110 and the through vias 113. In other words, the encapsulating material 115 encapsulates the processor die 110 therein, and the through vias 113 extends through the encapsulating material 115.

Figure 17:
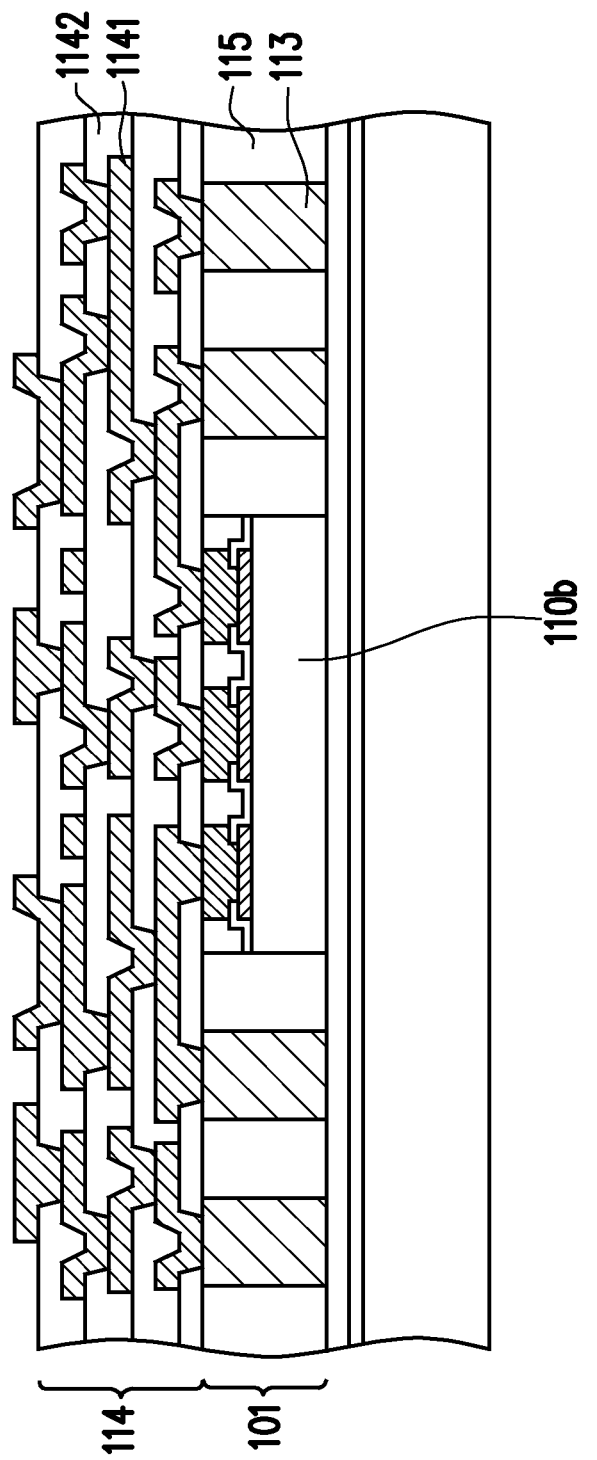

Next, referring to FIG. 17, a redistribution circuit structure 114 is formed over the processor die 110b and the encapsulating material 115. The redistribution circuit structure 114 is electrically connected to the processor die 110b and the through vias 113. In some embodiments, the redistribution circuit structure 114 are formed over the encapsulated processor die 101 to connect to the conductive vias of the processor die 110b and the through vias 113. The redistribution circuit structure 114 may be formed by, for example, depositing conductive layers, patterning the conductive layers to form redistribution circuits 1141, partially covering the redistribution circuits 1141 and filling the gaps between the redistribution circuits 1141 with dielectric layers 1142, etc. The material of the redistribution circuits 1141 may include a metal or a metal alloy including aluminum, copper, tungsten, and/or alloys thereof. The dielectric layers 1142 may be formed of dielectric materials such as oxides, nitrides, carbides, carbon nitrides, combinations thereof, and/or multi-layers thereof. The redistribution circuits 1141 are formed in the dielectric layers 1142 and electrically connected to the processor die 110b and the through vias 113.

Figure 18:
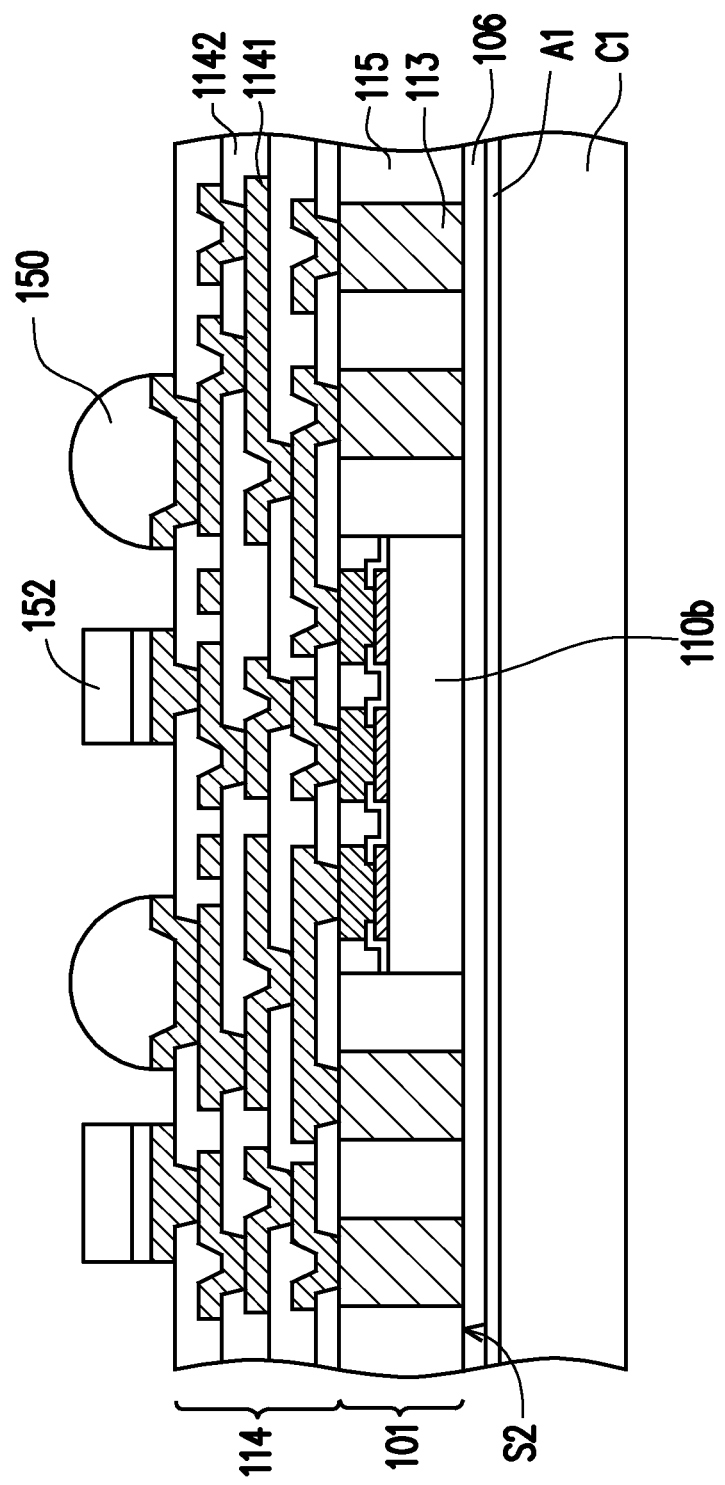

Referring to FIG. 18, at least one of connector (conductive bumps) 150 are disposed on the redistribution circuit structure 114 in accordance with some exemplary embodiments. In some embodiments, at least one integrated passive device (IPD) 152 may also be disposed on the redistribution circuit structure 114. The formation of the connectors 150 may include placing solder balls on an UBM layer (or on the redistribution circuit structure 114), and then reflowing the solder balls. In alternative embodiments, the formation of the connectors 150 may include performing a plating process to form solder regions on the redistribution circuit structure 114, and then reflowing the solder regions. The connectors 150 may also include conductive pillars, or conductive pillars with solder caps, which may also be formed through plating. The IPD 152 may be fabricated using standard wafer fabrication technologies such as thin film and photolithography processing, and may be mounted on the redistribution circuit structure 114 through, for example, flip-chip bonding or wire bonding, etc.

Figure 19:
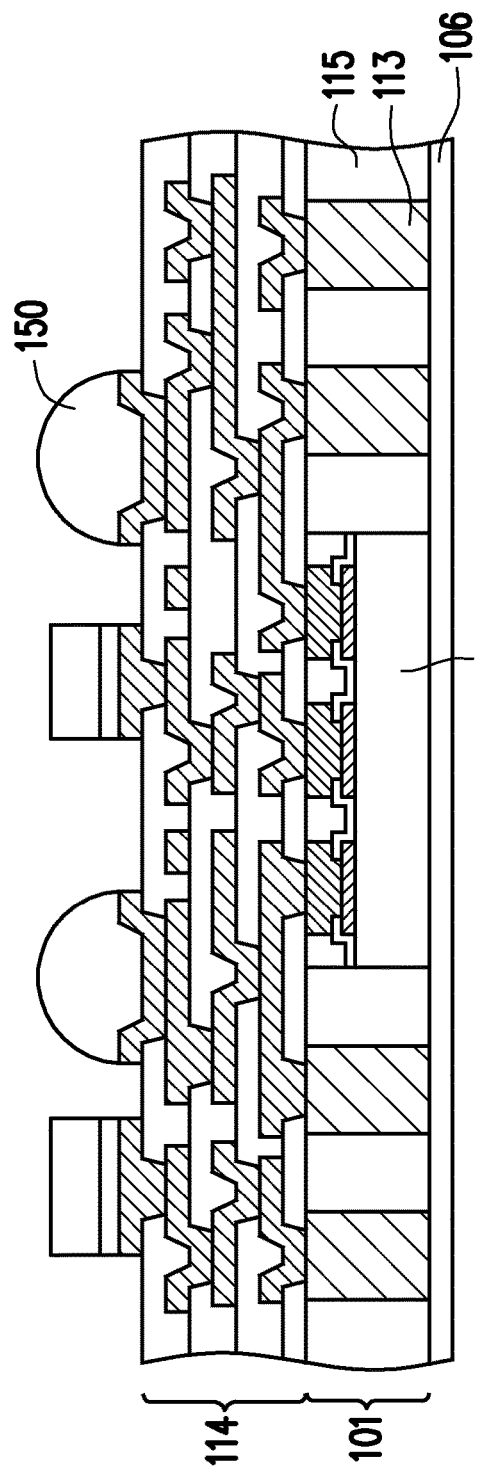

Then, referring to FIG. 19, the carrier C1 may be removed. In some embodiments, the carrier C1 is detached from the encapsulated processor die 101, and the insulation layer 106 (if any), by causing the adhesive layer A1 to lose or reduce adhesion. The adhesive layer Al is then removed along with the carrier C1. For example, the adhesive layer A1 may be exposed to UV light, so that the adhesive layer A1 loses or reduces adhesion, and hence the carrier C1 and the adhesive layer A1 can be removed from the encapsulated processor die 101.

In an embodiment of insulation layer 106 being omitted, the bottom ends of the through vias 113 are revealed after the carrier C1 is removed. In the illustrated structure, the bottom ends of the through vias 113 are level with the bottom surface of the processor die 110b and the bottom surface of the encapsulating material 115. A grinding process may be performed to lightly grind the back surface of the processor die 110b and the bottom ends of the through vias 113. Alternatively, the grinding process may be skipped.

Figure 20:
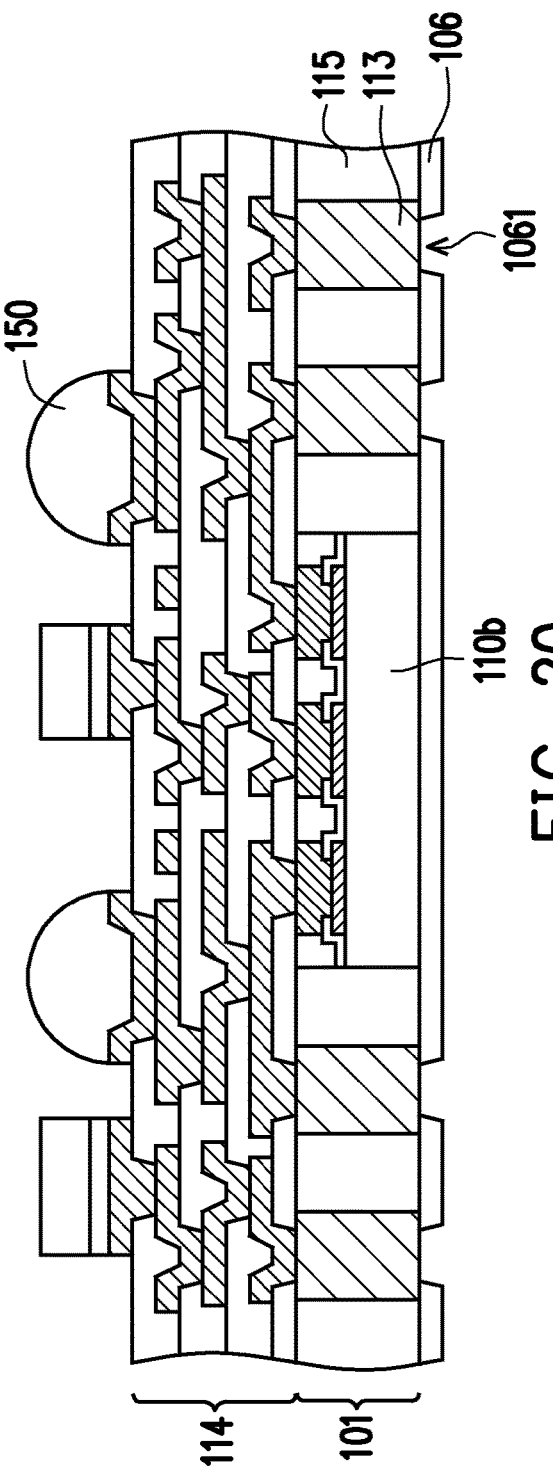

Referring to FIG. 20, in the embodiments having the insulation layer 106, a patterning process may then be performed on the insulation layer 106 to form a plurality of openings 1061. The openings 1061 are located on the through vias 113 respectively to reveal the bottom ends of the through vias 113. In some embodiments, the openings 1061 may be formed by photolithography process, laser drilling process, etc.

Figure 21:
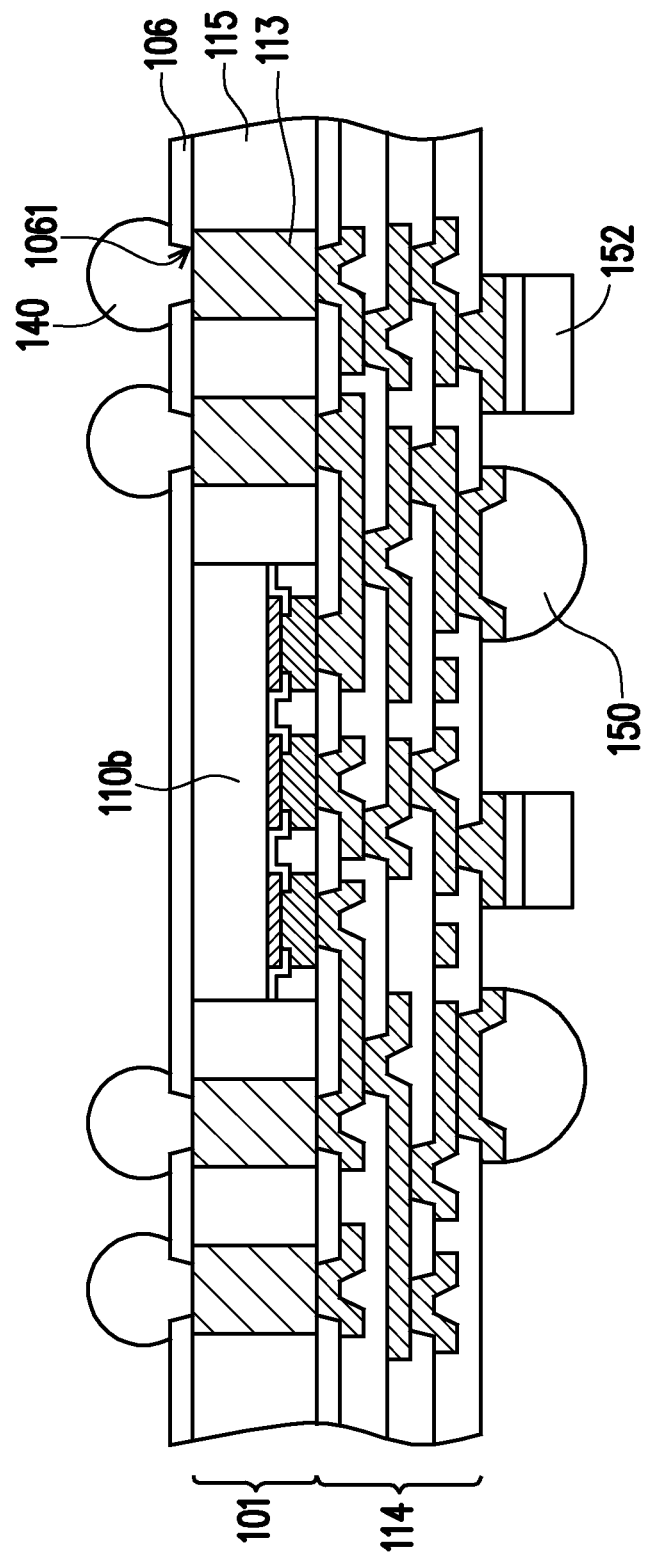

Referring to FIG. 21, a plurality of conductive bumps 140 may be formed on the encapsulated processor die 101 to be electrically connected to the through vias 113. In some embodiments, the conductive bumps 140 are disposed in the openings 1061 of the insulation layer 106 to be connected to the through vias 113. In some embodiments, the conductive bumps 140 may include micro bumps, or the like. Throughout the description, the resultant structure including the processor die 110b, the through vias 113, the encapsulating material 115, and the redistribution circuit structure 114 as shown in FIG. 21 is referred to as a processor package 105, which may have a wafer form in the process. Accordingly, in the processor package 105, the processor die 110b is surrounded by the through vias 113, which extend through the encapsulating material 115, and the encapsulating material 115 encapsulates the processor die 110b and the through vias 1113. The redistribution circuit structure 114 is disposed over the processor die 110b and the encapsulating material 115.

Figure 22:
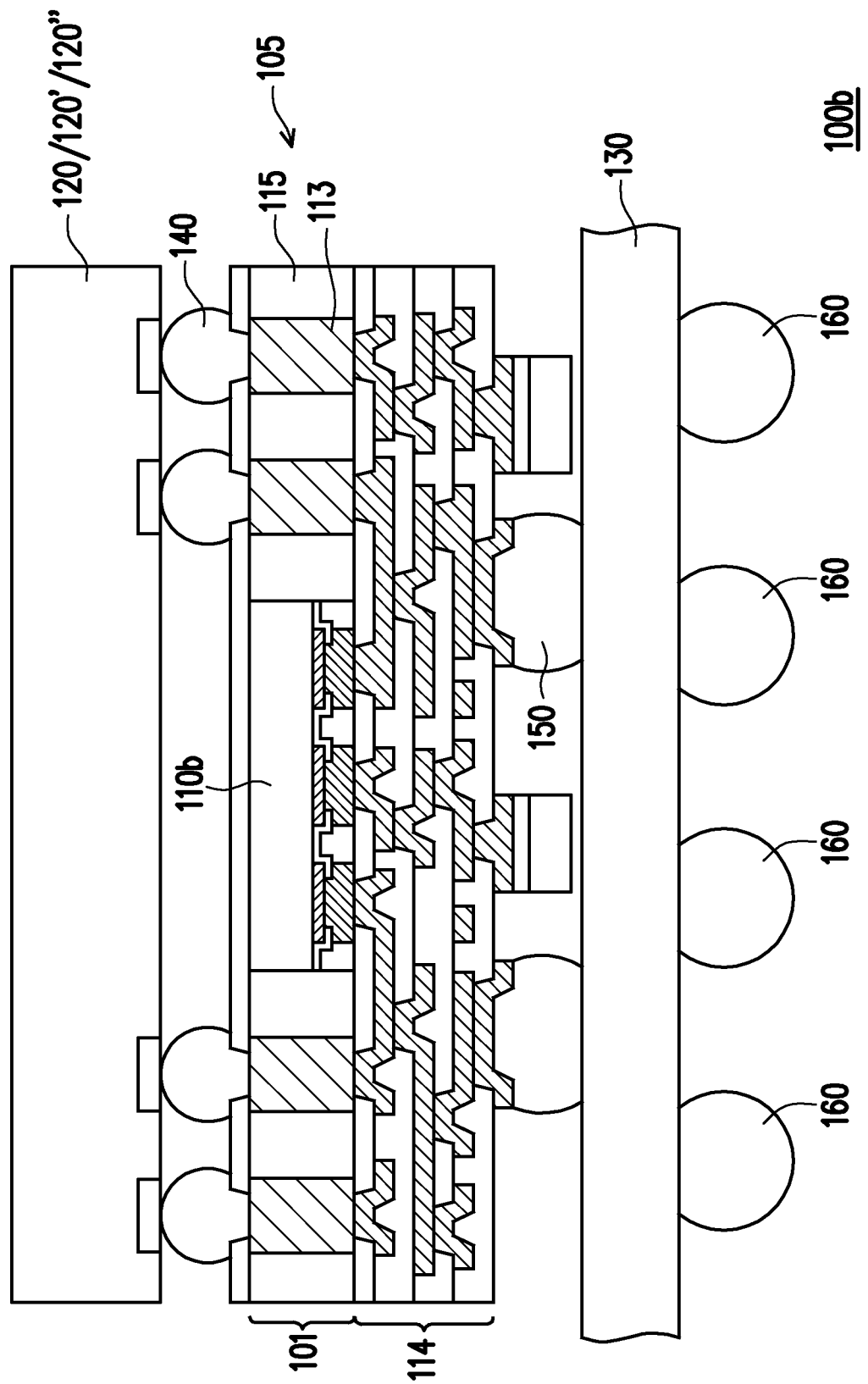

Then, referring to FIG. 22, the storage module 120, 120' or 120" is disposed on the 100 and is electrically connected to the through vias 113 through the conductive bumps 140 of the processor package 105. The storage module 120, 120' or 120" is mounted on the processor package 105 in a manner of the storage module 120, 120' or 120" through the conductive bumps 140. In some embodiments, the second package 200 may be packages, device dies, passive devices, and/or the like. The processor package 105 along with the storage module 120, 120' or 120" may then be sawed into a plurality of individual packages, and then one of the packages is mounted onto the package substrate 130 to form the semiconductor package 100b. In other embodiments, the processor package 105 may firstly be sawed into a plurality of individual packages, the storage module 120, 120' or 120" is then mounted on one of the packages, and the resultant structure is then mounted on the package substrate 130 to form the semiconductor package 100b. The disclosure does not limit the order of the process. Accordingly, the semiconductor package 100b include the processor package 105 and a vertically discrete storage module 120, 120' or 120" including a memory array and a cache array. The storage module 120, 120' or 120" may be electrically connected to the package substrate 130 through the through vias 113 of the processor package 105.

Based on the above discussions, it can be seen that the present disclosure offers various advantages. It is understood, however, that not all advantages are necessarily discussed herein, and other embodiments may offer different advantages, and that no particular advantage is required for all embodiments.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In accordance with some embodiments of the disclosure, a semiconductor package includes a processor die, a storage module and a package substrate. The storage module includes an array of cache units and an array of memory units stacked over one another, and electrically connected to the processor die, wherein the array of cache units is configured to hold copies of data stored in the array of memory units and frequently used by the processor die. The package substrate is on which the processor die and the storage module are disposed.

In accordance with some embodiments of the disclosure, a semiconductor package includes a processor die, a cache die, a memory die, and a package substrate. The cache die includes an array of MRAM cache units and electrically connected to the processor die. The memory die is stacked over the cache die and includes an array of memory units, wherein the memory die is electrically connected to the cache die and the processor die, and the cache die is configured to hold copies of data stored in the memory die and frequently used by the processor die. The package substrate is on which the processor die, the cache die and the memory die are disposed.

In accordance with some embodiments of the disclosure, a semiconductor package includes a processor die, a memory die, and a package substrate. The memory die is electrically connected to the processor die and includes an array of cache units and a vertically stacked array of memory units stacked over each other on a substrate, wherein the array of cache units is configured to hold copies of data stored in the vertically stacked array of memory units and frequently used by the processor die. The package substrate is on which the processor die and the memory die are disposed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor package, comprising:
a processor die comprising a memory cache;
a storage module comprising a cache die and a memory die stacked over one another, and electrically connected to the processor die, wherein the cache die is configured to hold copies of data stored in the memory die and frequently used by the processor die, wherein cache density of the cache die is greater than cache density of the memory cache of the processor die; and a package substrate on which the processor die and the storage module are disposed.

2. The semiconductor package as claimed in claim 1, wherein a type of the cache die comprises magnetoresistive random access memory (MRAM).

3. The semiconductor package as claimed in claim 1, wherein a type of the memory die comprises non-volatile memory (NVM), Vertical NAND flash memory, NOR flash memory, dynamic random access memory (DRAM), flash memory, phase change memory (PCM), resistive random access memory (RRAM).

4. The semiconductor package as claimed in claim 1, further comprising an interposer disposed on the package substrate, and the processor die and the storage module are disposed on the interposer in a side by side manner.

5. The semiconductor package as claimed in claim 1, wherein the storage module is disposed on the processor die, and the processor die is disposed on the package substrate.

6. The semiconductor package as claimed in claim 1, wherein the memory die is bonded to the cache die through a plurality of conductive bumps.

7. The semiconductor package as claimed in claim 1, wherein the memory die and the cache die are bonded with a plurality of micro bumps.

8. The semiconductor package as claimed in claim 1, wherein the memory die comprises a 3D memory die.

9. The semiconductor package as claimed in claim 1, wherein the processor die comprises a plurality of through vias extending through the processor die and electrically connecting the storage module and the package substrate.

10. The semiconductor package as claimed in claim 1, further comprising an encapsulating material at least laterally encapsulating the processor die and comprises a plurality of through vias extending through the encapsulating material and electrically connecting the storage module and the package substrate.

11. The semiconductor package as claimed in claim 1, wherein the storage module further comprises a front end of line structure and a first back end of line structure, and the cache die is disposed in the first back end of line structure over the front end of line structure.

12. The semiconductor package as claimed in claim 11, wherein the storage module further comprises a second back end of line structure, and the memory die is disposed in the second back end of line structure over the first back end of line structure.

13. A semiconductor package, comprising:
a processor die comprising a memory cache;
a cache die comprising a MRAM cache die and electrically connected to the processor die, wherein cache capacity of the cache die is greater than cache capacity of the processor die;
a memory die stacked over the cache die, wherein the memory die is electrically connected to the cache die and the processor die, and the cache die is configured to hold copies of data stored in the memory die and frequently used by the processor die, wherein cache density of the MRAM cache die is greater than cache density of the memory cache of the processor die; and
a package substrate on which the processor die, the cache die and the memory die are disposed.

14. The semiconductor package as claimed in claim 13, further comprising an interposer disposed on the package substrate, and the processor die and a stack of the cache die and the memory die are disposed on the interposer in a side by side manner.

15. The semiconductor package as claimed in claim 13, wherein a stack of the cache die and the memory die is disposed on the processor die, and the processor die is disposed on the package substrate.

16. The semiconductor package as claimed in claim 13, wherein the cache die further comprises a through substrate via vertically extending through a substrate of the cache die and electrically connecting cache die and the memory die.

17. A semiconductor package, comprising:
a processor die;
a memory die electrically connected to the processor die and comprising a substrate, a cache structure stacked over the substrate, a front end of line structure disposed between the substrate and the cache structure, and a memory structure stacked over the cache structure, wherein the cache structure is configured to hold copies of data stored in the memory structure and frequently used by the processor die; and
a package substrate, on which the processor die and the memory die are disposed.

18. The semiconductor package as claimed in claim 17, wherein the cache structure is disposed between the package substrate and the memory die.

19. The semiconductor package as claimed in claim 17, further comprising an interposer disposed on the package substrate, and the processor die and the memory die are disposed on the interposer in a side by side manner.

20. The semiconductor package as claimed in claim 17, wherein the memory die is disposed on the processor die, and the processor die is disposed on the package substrate.

21. The semiconductor package as claimed in claim 17, wherein a type of the cache structure comprises magnetoresistive random access memory (MRAM), and the memory die comprises a 3D memory.

* * * * *